US011435495B1

(12) United States Patent
Rossi

(10) Patent No.: US 11,435,495 B1
(45) Date of Patent: Sep. 6, 2022

(54) PRO SCANNER MAGNETIC STUD FINDER

(71) Applicant: Nick Rossi, Thompson, CT (US)

(72) Inventor: Nick Rossi, Thompson, CT (US)

( * ) Notice: Subject to any disclaimer, the term of this patent is extended or adjusted under 35 U.S.C. 154(b) by 0 days.

(21) Appl. No.: 17/227,339

(22) Filed: Apr. 11, 2021

(51) Int. Cl.
| | |
|---|---|
| *G01R 19/00* | (2006.01) |
| *G01V 3/08* | (2006.01) |
| *G01V 3/15* | (2006.01) |
| *G01R 29/08* | (2006.01) |
| *G01R 31/60* | (2020.01) |
| *G01R 31/58* | (2020.01) |

(52) U.S. Cl.
CPC ............... *G01V 3/08* (2013.01); *G01V 3/081* (2013.01); *G01V 3/15* (2013.01); *G01R 29/085* (2013.01); *G01R 31/58* (2020.01); *G01R 31/60* (2020.01)

(58) Field of Classification Search
CPC . G01V 3/08; G01V 3/15; G01V 3/081; G01R 29/085; G01R 31/60; G01R 31/58
USPC ........................................................ 324/66, 67
See application file for complete search history.

(56) References Cited

U.S. PATENT DOCUMENTS

| | | | |
|---|---|---|---|
| 2018/0091879 A1* | 3/2018 | Stanley | ............... F21V 3/00 |
| 2020/0204909 A1* | 6/2020 | Stanley | ............... H04R 31/006 |
| 2022/0003831 A1* | 1/2022 | de Jong | ............ G06K 19/07758 |

* cited by examiner

*Primary Examiner* — Raul J Rios Russo
(74) *Attorney, Agent, or Firm* — Dale Jensen, PLC; Dale Jensen

(57) ABSTRACT

Certain exemplary embodiments can provide a device comprising an upper housing, a lower housing, an electronics module, an electronics button, a side button, and a strip magnet. The strip magnet is coupled to the lower housing. The strip magnet is constructed to cause resistance to motion across a metal fastener. The resistance to motion is perceptible to a user of the device. The resistance is indicative of a location of the metal fastener and, thereby, allows the user of the device to locate the metal fastener if the electronics module fails to detect the metal fastener.

7 Claims, 4 Drawing Sheets

PRO SCANNER MAGNETIC STUD FINDER

BRIEF DESCRIPTION OF THE DRAWINGS

A wide variety of potential practical and useful embodiments will be more readily understood through the following detailed description of certain exemplary embodiments, with reference to the accompanying exemplary drawings in which.

DETAILED DESCRIPTION

Certain exemplary embodiments can provide a device comprising an upper housing, a lower housing, an electronics module, an electronics button, a side button, and a strip magnet. The strip magnet is coupled to the lower housing. The strip magnet is constructed to cause resistance to motion across a metal fastener. The resistance to motion is perceptible to a user of the device. The resistance is indicative of a location of the metal fastener and, thereby, allows the user of the device to locate the metal fastener if the electronics module fails to detect the metal fastener.

The strip magnet assists the user of the device to find drywall screws to locate studs when an electronic/battery portion of an electronic stud finder fails and/or is not used. The strip magnet is a fail-safe portion of an exemplary electronic stud finder.

Figure 1:
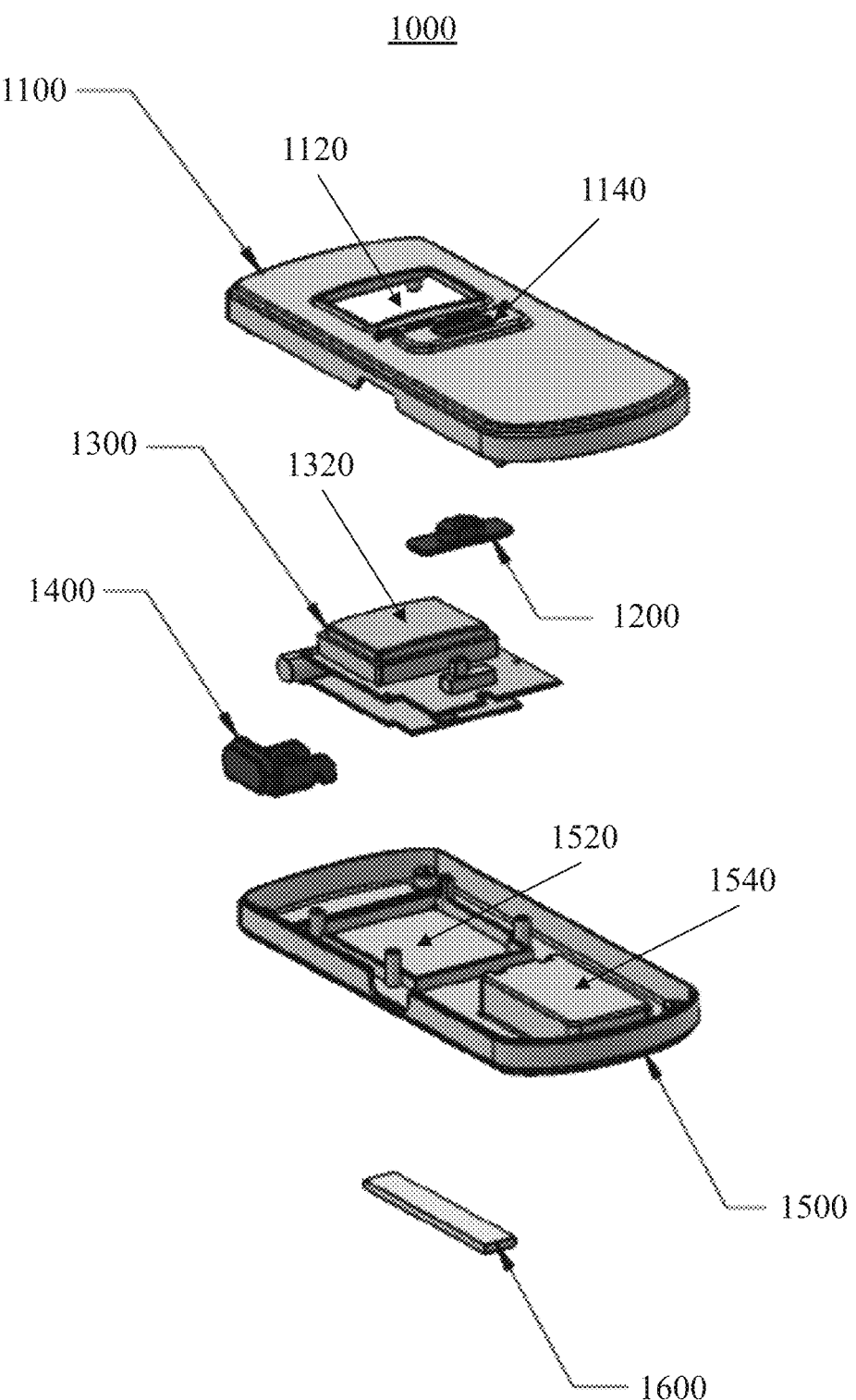
FIG. 1 is an exploded view diagram of an exemplary embodiment of an electronic stud finder 1000.

FIG. 1 is an exploded view diagram of an exemplary embodiment of an electronic stud finder 1000, which comprises:
- an upper housing 1100;
- a lower housing 1500, which is coupleable to upper housing 1100, lower housing 1500 comprising a cell 1520;
- an electronics module 1300, which comprises a user interface 1320, electronics module 1300 is constructed to fit in cell 1520 of lower housing 1500;
- an electronics button 1200, which is constructed to switch electronics module 1300 on and off;
- a side button 1400, which is constructed to reset electronics module 1300 after a stud is located;
- a strip magnet 1600, which is coupled to lower housing 1500, strip magnet 1600 is constructed to cause resistance to motion across a metal fastener, the resistance to motion perceptible to a user of stud finder 1000, the resistance indicative of a location of the metal fastener and, thereby, allows the user of stud finder 1000 to locate the metal fastener if electronics module 1300 fails to detect the metal fastener; and
- a battery 1540, which is coupled to at least one of upper housing 1100 and lower housing 1500, battery 1540 is electrically coupled to electronics module 1300.

Upper housing 1100 defines a first port 1140. First port 1140 is sized to allow electronics button 1200 to protrude from upper housing 1100, wherein a user of stud finder 1000 can actuate electronics button 1200 via a second port 1120.

Upper housing 1100 defines second port 1120. Second port 1120 is sized to allow a user of the device to view user interface 1320 of electronics module 1300.

Figure 2:
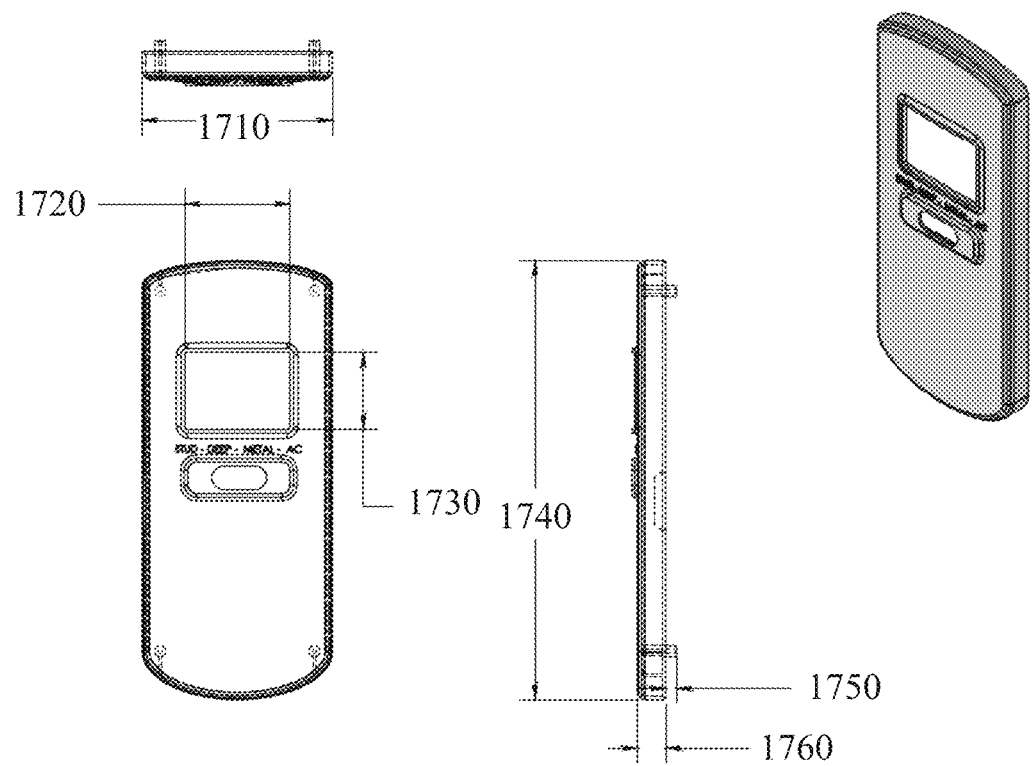
FIG. 2 is a dimensioned diagram of an exemplary embodiment of a system 2000.

FIG. 2 is a dimensioned diagram of an exemplary embodiment of a system 2000, which is an exemplary upper housing for a stud finder. System 2000 shows dimensions, which can vary between embodiments. The dimensions listed below are typical and not restrictive:
- Upper housing width 1710, which can be approximately 3.25 inches;
- Port width 1720, which can be approximately 1.79 inches;
- Port height 1730, which can be approximately 1.32 inches;
- Upper housing height 1740, which can be approximately 7.50 inches;
- Prong projection 1750, which can be approximately 0.18 inches; and
- Thickness 1760, which can be approximately 0.48 inches.

Figure 3:
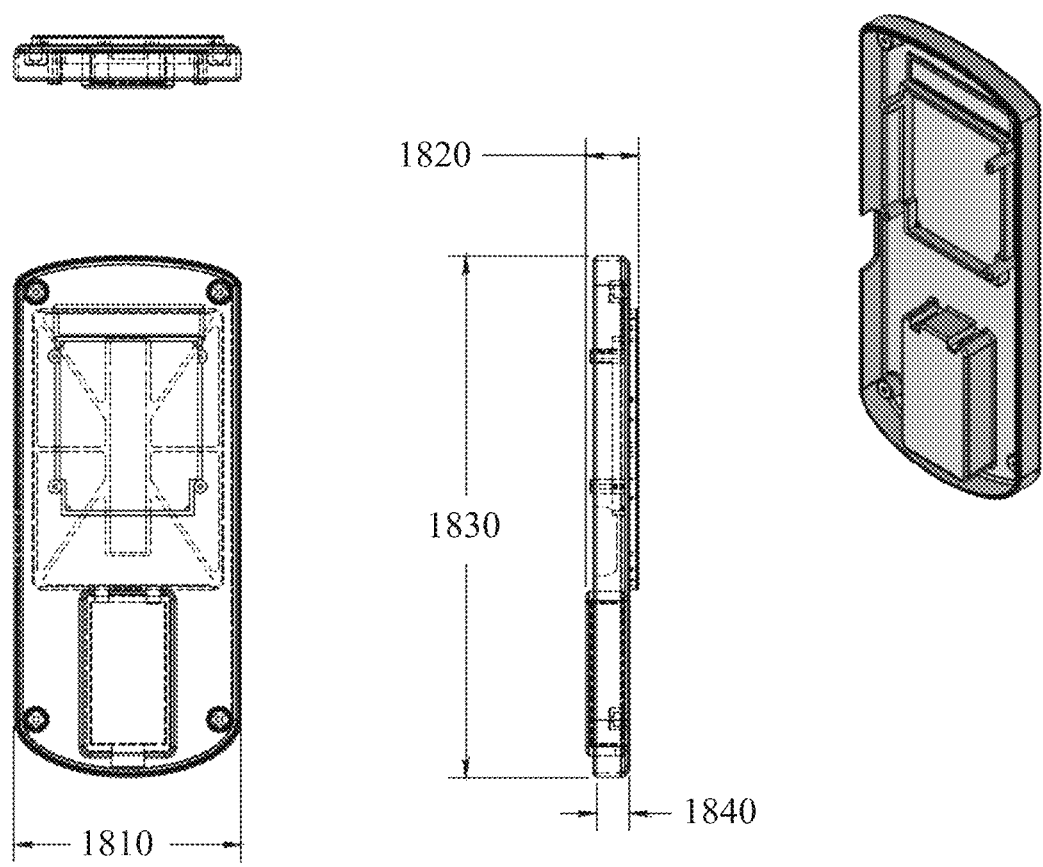
FIG. 3 is a dimensioned diagram of an exemplary embodiment of a system 3000.

FIG. 3 is a dimensioned diagram of an exemplary embodiment of a system 3000, which is an exemplary lower housing for a stud finder. System 3000 shows dimensions, which can vary between embodiments. The dimensions listed below are typical and not restrictive:
- Lower housing width 1810, which can be approximately 3.25 inches;
- Lower housing thickness 1820, which can be approximately 0.75 inches;
- Lower housing height 1830, which can be approximately 7.50 inches; and
- Lower housing thickness 1840, which can be approximately 0.48 inches.

Figure 4:
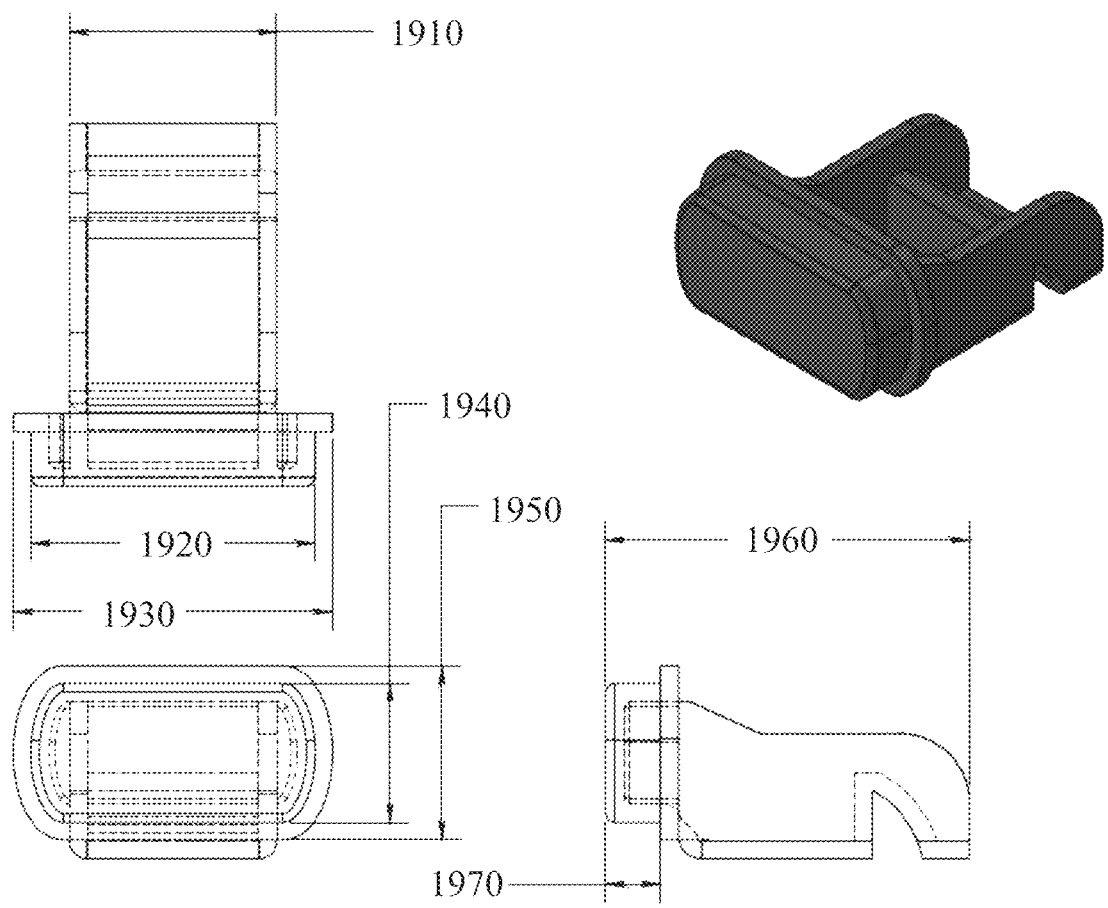
FIG. 4 is a dimensioned diagram of an exemplary embodiment of a system 4000.

FIG. 4 is a dimensioned diagram of an exemplary embodiment of a system 4000, which is an exemplary side button for a stud finder. System 4000 shows dimensions, which can vary between embodiments. The dimensions listed below are typical and not restrictive:
- A pad width 1910, which can be approximately 0.71 inches;
- An exposed width 1920, which can be approximately 0.98 inches;
- An overall width 1930, which can be approximately 1.10 inches;
- An exposed thickness 1940, which can be approximately 0.48 inches;
- An overall thickness 1950, which can be approximately 0.60 inches;
- An length 1960, which can be approximately 1.25 inches; and
- An exposed length 1970, which can be approximately 0.19 inches.

Definitions

When the following terms are used substantively herein, the accompanying definitions apply. These terms and definitions are presented without prejudice, and, consistent with the application, the right to redefine these terms during the prosecution of this application or any application claiming priority hereto is reserved. For the purpose of interpreting a claim of any patent that claims priority hereto, each definition (or redefined term if an original definition was amended during the prosecution of that patent), functions as a clear and unambiguous disavowal of the subject matter outside of that definition.

a—at least one.
across—from a first side of something to a second side of the something.
activity—an action, act, step, and/or process or portion thereof
actuate—to put into mechanical action.

adapter—a device used to effect operative compatibility between different parts of one or more pieces of an apparatus or system.

allow—to position so as to facilitate an action.

and/or—either in conjunction with or in alternative to.

apparatus—an appliance or device for a particular purpose associate—to join, connect together, and/or relate.

automatically—acting or operating in a manner essentially independent of external influence or control. For example, an automatic light switch can turn on upon "seeing" a person in its view, without the person manually operating the light switch.

battery—one or more electrochemical cells adapted to convert stored chemical energy into electrical energy.

button—a part of a device that can be pushed to cause a change in device function.

can—is capable of, in at least some embodiments.

cause—to produce an effect.

cell—a bounded space.

circuit—an electrically conductive pathway and/or a communications connection established across two or more switching devices comprised by a network and between corresponding end systems connected to, but not comprised by the network.

comprising—including but not limited to.

configure—to make suitable or fit for a specific use or situation.

connect—to join or fasten together.

constructed to—made to and/or designed to.

convert—to transform, adapt, and/or change.

couple—to physically join in some fashion.

coupleable—capable of being joined, connected, and/or linked together.

create—to bring into being.

data—distinct pieces of information, usually formatted in a special or predetermined way and/or organized to express concepts.

define—to establish the outline, form, or structure of detect—to sense or perceive.

determine—to obtain, calculate, decide, deduce, and/or ascertain.

device—a machine, manufacture, and/or collection thereof.

electrically coupled—connected in a manner adapted to transfer electrical energy.

electronic—comprising transistors and/or silicon chips which control and change an electric current passing therethrough.

estimate—to calculate and/or determine approximately and/or tentatively.

failure—to cease proper functioning or performance.

fastener—one (or more) restraints that attach to, extend through, penetrate, and/or hold something. For example, a fastener can be one (or more) bolt and nut assembly, rivet, weldment, nail, screw, and/or staple, etc.

fit—to have a predetermined shape and size that conforms to dimensions of something.

generate—to create, produce, give rise to, and/or bring into existence.

haptic—involving the human sense of kinesthetic movement and/or the human sense of touch. Among the many potential haptic experiences are numerous sensations, body-positional differences in sensations, and time-based changes in sensations that are perceived at least partially in non-visual, non-audible, and non-olfactory manners, including the experiences of tactile touch (being touched), active touch, grasping, pressure, friction, traction, slip, stretch, force, torque, impact, puncture, vibration, motion, acceleration, jerk, pulse, orientation, limb position, gravity, texture, gap, recess, viscosity, pain, itch, moisture, temperature, thermal conductivity, and thermal capacity.

housing—an enclosing, covering, protecting, and/or supporting frame, box, and/or chassis.

indicative—signifying.

indicator—a sensorialy apparent component, such as via a lamp, light, strobe, LED, OLED, LCD, display, monitor, electric paper, flag, etc., and/or audibly, such as via a horn, annunciator, beeper, whistle, speaker, and/or siren, etc.

information device—any device capable of processing data and/or information, such as any general purpose and/or special purpose computer, such as a personal computer, workstation, server, minicomputer, mainframe, supercomputer, computer terminal, laptop, wearable computer, and/or Personal Digital Assistant (PDA), mobile terminal, Bluetooth device, communicator, "smart" phone (such as a Treo-like device), messaging service (e.g., Blackberry) receiver, pager, facsimile, cellular telephone, a traditional telephone, telephonic device, a programmed microprocessor or microcontroller and/or peripheral integrated circuit elements, an ASIC or other integrated circuit, a hardware electronic logic circuit such as a discrete element circuit, and/or a programmable logic device such as a PLD, PLA, FPGA, or PAL, or the like, etc. In general any device on which resides a finite state machine capable of implementing at least a portion of a method, structure, and/or or graphical user interface described herein may be used as an information device. An information device can comprise components such as one or more network interfaces, one or more processors, one or more memories containing instructions, and/or one or more input/output (I/O) devices, one or more user interfaces coupled to an I/O device, etc.

initialize—to prepare something for use and/or some future event.

input/output (I/O) device—any sensory-oriented input and/or output device, such as an audio, visual, haptic, olfactory, and/or taste-oriented device, including, for example, a monitor, display, projector, overhead display, keyboard, keypad, mouse, trackball, joystick, gamepad, wheel, touchpad, touch panel, pointing device, microphone, speaker, video camera, camera, scanner, printer, haptic device, vibrator, tactile simulator, and/or tactile pad, potentially including a port to which an I/O device can be attached or connected.

install—to connect or set in position and prepare for use.

locate—to position or be positioned.

lower—below when a device is pointed skyward.

machine instructions—directions adapted to cause a machine, such as an information device, to perform one or more particular activities, operations, or functions. The directions, which can sometimes form an entity called a "processor", "kernel", "operating system", "program", "application", "utility", "subroutine", "script", "macro", "file", "project", "module", "library", "class", and/or "object", etc., can be embodied as machine code, source code, object code, compiled code, assembled code, interpretable code, and/or executable code, etc., in hardware, firmware, and/or software.

machine readable medium—a physical structure from which a machine can obtain data and/or information. Examples include a memory, punch cards, etc.

magnet—a material or object that produces a magnetic field.

may—is allowed and/or permitted to, in at least some embodiments.

memory device—an apparatus capable of storing analog or digital information, such as instructions and/or data. Examples include a non-volatile memory, volatile memory, Random Access Memory, RAM, Read Only Memory, ROM, flash memory, magnetic media, a hard disk, a floppy disk, a magnetic tape, an optical media, an optical disk, a compact disk, a CD, a digital versatile disk, a DVD, and/or a raid array, etc. The memory device can be coupled to a processor and/or can store instructions adapted to be executed by processor, such as according to an embodiment disclosed herein.

metal—a material that is typically hard, opaque, shiny, and has good electrical and thermal conductivity.

method—a process, procedure, and/or collection of related activities for accomplishing something.

module—a packaged functional assembly of electronic components.

motion—a process via which something changes position from one location to another.

network—a communicatively coupled plurality of nodes. A network can be and/or utilize any of a wide variety of sub-networks, such as a circuit switched, public-switched, packet switched, data, telephone, telecommunications, video distribution, cable, terrestrial, broadcast, satellite, broadband, corporate, global, national, regional, wide area, backbone, packet-switched TCP/IP, Fast Ethernet, Token Ring, public Internet, private, ATM, multi-domain, and/or multi-zone sub-network, one or more Internet service providers, and/or one or more information devices, such as a switch, router, and/or gateway not directly connected to a local area network, etc.

network interface—any device, system, or subsystem capable of coupling an information device to a network. For example, a network interface can be a telephone, cellular phone, cellular modem, telephone data modem, fax modem, wireless transceiver, ethernet card, cable modem, digital subscriber line interface, bridge, hub, router, or other similar device.

off—electrically de-energized.

on—electrically energized.

packet—a discrete instance of communication.

plurality—the state of being plural and/or more than one.

port—an opening for the insertion and/or passage of a part.

predetermined—established in advance.

probability—a quantitative representation of a likelihood of an occurrence.

processor—a device and/or set of machine-readable instructions for performing one or more predetermined tasks. A processor can comprise any one or a combination of hardware, firmware, and/or software. A processor can utilize mechanical, pneumatic, hydraulic, electrical, magnetic, optical, informational, chemical, and/or biological principles, signals, and/or inputs to perform the task(s). In certain embodiments, a processor can act upon information by manipulating, analyzing, modifying, converting, transmitting the information for use by an executable procedure and/or an information device, and/or routing the information to an output device. A processor can function as a central processing unit, local controller, remote controller, parallel controller, and/or distributed controller, etc. Unless stated otherwise, the processor can be a general-purpose device, such as a microcontroller and/or a microprocessor, such the Pentium IV series of microprocessor manufactured by the Intel Corporation of Santa Clara, Calif. In certain embodiments, the processor can be dedicated purpose device, such as an Application Specific Integrated Circuit (ASIC) or a Field Programmable Gate Array (FPGA) that has been designed to implement in its hardware and/or firmware at least a part of an embodiment disclosed herein.

project—to calculate, estimate, or predict.

protrude—to extend beyond or above a surface.

provide—to furnish, supply, give, and/or make available.

receive—to get as a signal, take, acquire, and/or obtain.

recommend—to suggest, praise, commend, and/or endorse.

render—to make perceptible to a human, for example as data, commands, text, graphics, audio, video, animation, and/or hyperlinks, etc., such as via any visual, audio, and/or haptic means, such as via a display, monitor, electric paper, ocular implant, cochlear implant, speaker, etc.

repeatedly—again and again; repetitively.

request—to express a desire for and/or ask for.

reset—to clear a first set of data and begin collecting a second set of data.

resistance—an opposing force.

select—to make a choice or selection from alternatives.

set—a related plurality.

side—a bounding surface of an object.

signal—information, such as machine instructions for activities and/or one or more letters, words, characters, symbols, signal flags, visual displays, and/or special sounds, etc. having prearranged meaning, encoded as automatically detectable variations in a physical variable, such as a pneumatic, hydraulic, acoustic, fluidic, mechanical, electrical, magnetic, optical, chemical, and/or biological variable, such as power, energy, pressure, flowrate, viscosity, density, torque, impact, force, frequency, phase, voltage, current, resistance, magnetomotive force, magnetic field intensity, magnetic field flux, magnetic flux density, reluctance, permeability, index of refraction, optical wavelength, polarization, reflectance, transmittance, phase shift, concentration, and/or temperature, etc. Depending on the context, a signal and/or the information encoded therein can be synchronous, asynchronous, hard real-time, soft real-time, non-real time, continuously generated, continuously varying, analog, discretely generated, discretely varying, quantized, digital, broadcast, multicast, unicast, transmitted, conveyed, received, continuously measured, discretely measured, processed, encoded, encrypted, multiplexed, modulated, spread, de-spread, demodulated, detected, de-multiplexed, decrypted, and/or decoded, etc.

size—to have a predetermined set of dimensions.

store—to place, hold, and/or retain.

strip—a long narrow piece of a material.

stud—a vertical support in a walls of a building to which wall materials are fastened via metal fasteners.

substantially—to a great extent or degree.

support—to bear the weight of, especially from below.

switch—(n) a mechanical, electrical, and/or electronic device that opens and/or closes circuits, completes and/or breaks an electrical path, and/or selects paths and/or circuits; (v) electrically energize or de-energize.

system—a collection of mechanisms, devices, machines, articles of manufacture, processes, data, and/or instructions, the collection designed to perform one or more specific functions.

thereby—by that means.

transmit—to send as a signal, provide, furnish, and/or supply.

upper—above when a device is pointed skyward.

user—a person interfacing with a device.

user interface—any device for rendering information to a user and/or requesting information from the user. A user interface includes at least one of textual, graphical, audio, video, animation, and/or haptic elements. A textual element can be provided, for example, by a printer, monitor, display, projector, etc. A graphical element can be provided, for example, via a monitor, display, projector, and/or visual indication device, such as a light, flag, beacon, etc. An audio element can be provided, for example, via a speaker, microphone, and/or other sound generating and/or receiving device. A video element or animation element can be provided, for example, via a monitor, display, projector, and/or other visual device. A haptic element can be provided, for example, via a very low frequency speaker, vibrator, tactile stimulator, tactile pad, simulator, keyboard, keypad, mouse, trackball, joystick, gamepad, wheel, touchpad, touch panel, pointing device, and/or other haptic device, etc. A user interface can include one or more textual elements such as, for example, one or more letters, number, symbols, etc. A user interface can include one or more graphical elements such as, for example, an image, photograph, drawing, icon, window, title bar, panel, sheet, tab, drawer, matrix, table, form, calendar, outline view, frame, dialog box, static text, text box, list, pick list, pop-up list, pull-down list, menu, tool bar, dock, check box, radio button, hyperlink, browser, button, control, palette, preview panel, color wheel, dial, slider, scroll bar, cursor, status bar, stepper, and/or progress indicator, etc. A textual and/or graphical element can be used for selecting, programming, adjusting, changing, specifying, etc. an appearance, background color, background style, border style, border thickness, foreground color, font, font style, font size, alignment, line spacing, indent, maximum data length, validation, query, cursor type, pointer type, autosizing, position, and/or dimension, etc. A user interface can include one or more audio elements such as, for example, a volume control, pitch control, speed control, voice selector, and/or one or more elements for controlling audio play, speed, pause, fast forward, reverse, etc. A user interface can include one or more video elements such as, for example, elements controlling video play, speed, pause, fast forward, reverse, zoom-in, zoom-out, rotate, and/or tilt, etc. A user interface can include one or more animation elements such as, for example, elements controlling animation play, pause, fast forward, reverse, zoom-in, zoom-out, rotate, tilt, color, intensity, speed, frequency, appearance, etc. A user interface can include one or more haptic elements such as, for example, elements utilizing tactile stimulus, force, pressure, vibration, motion, displacement, temperature, etc.

via—by way of and/or utilizing.

weight—a value indicative of importance.

Note

Still other substantially and specifically practical and useful embodiments will become readily apparent to those skilled in this art from reading the above-recited and/or herein-included detailed description and/or drawings of certain exemplary embodiments. It should be understood that numerous variations, modifications, and additional embodiments are possible, and accordingly, all such variations, modifications, and embodiments are to be regarded as being within the scope of this application.

Thus, regardless of the content of any portion (e.g., title, field, background, summary, description, abstract, drawing figure, etc.) of this application, unless clearly specified to the contrary, such as via explicit definition, assertion, or argument, with respect to any claim, whether of this application and/or any claim of any application claiming priority hereto, and whether originally presented or otherwise:

there is no requirement for the inclusion of any particular described or illustrated characteristic, function, activity, or element, any particular sequence of activities, or any particular interrelationship of elements;

no characteristic, function, activity, or element is "essential";

any elements can be integrated, segregated, and/or duplicated;

any activity can be repeated, any activity can be performed by multiple entities, and/or any activity can be performed in multiple jurisdictions; and any activity or element can be specifically excluded, the sequence of activities can vary, and/or the interrelationship of elements can vary.

Moreover, when any number or range is described herein, unless clearly stated otherwise, that number or range is approximate. When any range is described herein, unless clearly stated otherwise, that range includes all values therein and all subranges therein. For example, if a range of 1 to 10 is described, that range includes all values therebetween, such as for example, 1.1, 2.5, 3.335, 5, 6.179, 8.9999, etc., and includes all subranges therebetween, such as for example, 1 to 3.65, 2.8 to 8.14, 1.93 to 9, etc.

When any claim element is followed by a drawing element number, that drawing element number is exemplary and non-limiting on claim scope. No claim of this application is intended to invoke paragraph six of 35 USC 112 unless the precise phrase "means for" is followed by a gerund.

Any information in any material (e.g., a United States patent, United States patent application, book, article, etc.) that has been incorporated by reference herein, is only incorporated by reference to the extent that no conflict exists between such information and the other statements and drawings set forth herein. In the event of such conflict, including a conflict that would render invalid any claim herein or seeking priority hereto, then any such conflicting information in such material is specifically not incorporated by reference herein.

Accordingly, every portion (e.g., title, field, background, summary, description, abstract, drawing figure, etc.) of this application, other than the claims themselves, is to be regarded as illustrative in nature, and not as restrictive, and the scope of subject matter protected by any patent that issues based on this application is defined only by the claims of that patent.

What is claimed is:

1. A device comprising:
an upper housing;
a lower housing, the lower housing coupleable to the upper housing;
an electronics module; and
a strip magnet, the strip magnet coupled to the lower housing, the strip magnet constructed to cause resistance to motion across a metal fastener, the resistance to motion perceptible to a user of the device, the resistance indicative of a location of the metal fastener and, thereby, allows the user of the device to locate the metal fastener if the electronics module fails to detect the metal fastener.

2. The device of claim 1, further comprising:
an electronics button, the electronics button constructed to switch the electronics module on and off.

3. The device of claim 1, further comprising:
a side button, the side button constructed to reset the electronics module after a stud is located.

4. The device of claim 1, further comprising:
a battery, the battery coupled to at least one of the upper housing and the lower housing, the battery electrically coupled to the electronics module.

5. The device of claim 1, wherein:
the upper housing defines a port, the port is sized to allow an electronics button to protrude from the upper housing, wherein a user of the device can actuate the electronics button via the port.

6. The device of claim 1, wherein:
the upper housing defines a port, the port is sized to allow a user of the device to view a user interface of the electronics module.

7. The device of claim 1, wherein:
the lower housing comprises a cell;
the electronics module comprises a user interface; and
the electronics module is constructed to fit in the cell of the lower housing.

* * * * *